United States Patent
Byagowi et al.

(10) Patent No.: US 11,042,414 B1
(45) Date of Patent: Jun. 22, 2021

(54) HARDWARE ACCELERATED COMPUTE KERNELS

(71) Applicant: Facebook, Inc., Menlo Park, CA (US)

(72) Inventors: Ahmad Byagowi, Fremont, CA (US); Michael Maroye Lambeta, Mountain View, CA (US); Martin Mroz, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 89 days.

(21) Appl. No.: 16/508,093

(22) Filed: Jul. 10, 2019

(51) Int. Cl.
*G06F 9/50* (2006.01)
*G06F 30/34* (2020.01)

(52) U.S. Cl.
CPC .............. *G06F 9/505* (2013.01); *G06F 30/34* (2020.01)

(58) Field of Classification Search
CPC ...................................................... G06F 9/505
See application file for complete search history.

(56) References Cited

U.S. PATENT DOCUMENTS

| | | | |
|---|---|---|---|
| 5,946,219 A | 8/1999 | Mason | |
| 7,716,497 B1 | 5/2010 | Trimberger | |
| 2003/0086300 A1* | 5/2003 | Noyes | G06F 9/547 |
| | | | 365/189.15 |
| 2014/0082629 A1 | 3/2014 | Ash | |
| 2017/0262567 A1* | 9/2017 | Vassiliev | H03K 19/17736 |
| 2018/0121250 A1 | 5/2018 | Qi | |
| 2019/0138890 A1* | 5/2019 | Liang | G06N 3/08 |
| 2019/0227843 A1* | 7/2019 | Custodio | G06F 9/505 |
| 2019/0317802 A1* | 10/2019 | Bachmutsky | G06F 9/4843 |
| 2019/0324856 A1* | 10/2019 | Zhao | G06T 1/20 |
| 2020/0301722 A1 | 9/2020 | Li | |

* cited by examiner

*Primary Examiner* — Charlie Sun
(74) *Attorney, Agent, or Firm* — Van Pelt, Yi & James LLP (57) ABSTRACT

A request to perform a compute task is received. A service to perform at least a portion of the compute task is identified, wherein the identified service is associated with a field-programmable gate array that has been programmed to perform at least the portion of the compute task. The identified service to perform at least the portion of the compute task of the request is invoked. At least the portion of the compute task is executed using the field-programmable gate array.

20 Claims, 8 Drawing Sheets

HARDWARE ACCELERATED COMPUTE KERNELS

BACKGROUND OF THE INVENTION

Data centers are facilities used to store computer systems and components, such as data storage systems and their associated components. Modern data centers are typically large facilities whose computer systems are used to store large amounts of data and perform compute tasks on such data. The tremendous increase in the generation and consumption of data in recent times has been a catalyst for the utilization of more and more data centers to store and process these vast amounts of data. One challenge associated with performing compute tasks in data center environments is addressing computational problems that are not handled efficiently by traditional central processing units (CPUs) but do not occur frequently enough to justify the substantial non-recurring engineering (NRE) costs and development time associated with specially designed hardware, such as application-specific integrated circuits (ASICs).

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Certain classes of highly-parallelizable data center compute tasks, e.g., signal processing, image processing and machine learning, can be efficiently implemented on specially designed hardware. This approach is challenging due to the substantial NRE costs and development (e.g., design, validation, deployment, etc.) time associated with specially designed hardware such as ASICs. High-performance and high-efficiency field-programmable gate arrays (FPGAs), which perform better and more efficiently than CPUs, present a compute alternative to accelerate algorithms which are not used frequently enough to justify the cost of a custom ASIC solution.

An FPGA-based server system is disclosed. The disclosed server system includes a processor configured to: receive a request to perform a compute task, identify a service to perform at least a portion of the compute task (wherein the identified service is associated with a field-programmable gate array that has been programmed to perform at least a portion of the compute task), and invoke the identified service to perform at least the portion of the compute task of the request. The disclosed server system also includes the field-programmable gate array, wherein at least the portion of the compute task is executed using the field-programmable gate array.

A practical and technological benefit of this FPGA-based server system is the capability to accelerate algorithms (due to use of specialized hardware) that are not used frequently enough to justify the cost of a custom ASIC solution, thus achieving better performance than with CPUs. This flexibility of FPGAs is due to the programmable and reprogrammable nature of FPGAs, allowing them to handle specialized compute tasks and to be reconfigured to handle different specialized compute tasks as needed. Thus, the disclosed system is able to adaptively respond to computing demands. While FPGAs may be less power efficient than ASICs, they can be significantly more power efficient than CPUs (in addition to being more computationally efficient than CPUs).

Furthermore, ASICs cannot be reconfigured, but FPGAs are flexible enough to allow future changes and optimization. FPGAs can also outperform graphics processing units (GPUs). Although GPUs can take advantage of data linearization to outperform CPUs, FPGAs are oftentimes more efficient still (e.g., in terms of speed and power efficiency). FPGA resources are dynamically reprogrammable and therefore are uniquely able to respond to changes in demand for specific kinds of applications. When a CPU is performing large volumes of integer arithmetic, the remaining on-chip functional units (e.g., floating-point or vector units) go unused and simply power down. The same is true on a system level with other special-purpose compute units such as GPUs. FPGAs are capable of physically transforming into different kinds of resources on the fly.

In some embodiments, the system includes an application programming interface (API), a scheduler/router, and a plurality of FPGAs. The API exposes the FPGAs to users (e.g., various software applications) that would like to use the FPGAs for compute tasks. In various embodiments, the API receive requests to perform various compute tasks (e.g., execute various algorithms, wherein different algorithms are programmed on different FPGAs). The scheduler/router is responsible for receiving inbound requests, queuing them as necessary, and delivering them to appropriate interface software (interfacing with the FPGAs). In various embodiments, the interface software is capable of, when given a suitably structured request, executing a function on an FPGA and returning resulting data.

From a high-level perspective, the system exposes a traditional API endpoint to customers/users defined in the same way as existing remote procedure calls (RPCs) for services (e.g., REST, Thrift, gRPC, and similar models). Data dependencies are encoded within the request and all data is returned in the response, thereby yielding a stateless system. The system is therefore agnostic to the language, operating system, and conditions of the API customer, and independent of the physical location where systems are deployed. Scheduling/routing is performed by mapping incoming API requests to available FPGAs that implement the relevant functions (e.g., algorithms). In various embodiments, metrics are collected to inform subsequent scheduling/routing efforts. For example, a cost function can include such metrics as how much energy was expended executing the request, how well the work was performed, and latency and average execution durations. The disclosed server system provides for disaggregation of nodes across racks, pods, and data centers, and service requests can be intelligently mapped to nodes configured to accept the incoming function signatures.

FPGAs are especially suitable for compute tasks that are time-consuming and would benefit from specialized hardware but do not occur frequently enough to justify the investment costs to develop an ASIC. An example of this type of compute task is graphics interchange format (GIF) resizing (e.g., resizing a small thumbnail GIF). GIF resizing can take a long time to process on a traditional CPU (e.g., several tens of seconds). Another advantage of FPGAs is that performance can be monitored for a period of time (e.g., a week, a month, etc.), adjustments can be made, and results can be monitored again (e.g., a learning loop). For example, if it is discovered that a specific compute task occurs very frequently, it can be decided that an investment in an ASIC implementation is warranted.

As described above, an overall, top-level architecture includes an API, a schedules/router, interface software between the scheduler/router and hardware, and hardware (e.g., a plurality of FPGAs). In some embodiments, the hardware can be reconfigured dynamically (e.g., dynamic reconfiguration of FPGAs). For example, FPGAs can be de-configured in response to demand (e.g., enter a neutral state before a new configuration is uploaded) and reconfigured (reprogrammed with a new function in response to increased demand for the new function) (e.g., see FIG. 7). Compute tasks may be reassigned based on analysis of performance after a specified period of time (e.g., an hour, a day, a week, a month, etc.). The top-level architecture described above may also be extended to allow for heterogeneous hardware resources (e.g., a mix of FPGAs, ASICs, CPUs, and GPUs) to be used within the system architecture/paradigm (e.g., see FIG. 8). In this heterogeneous compute environment, certain compute tasks may only be programmed on certain hardware resources, which can be taken into consideration when assigning compute tasks to hardware resources. The scheduler/router has added responsibility to consider such additional factors.

Figure 1:
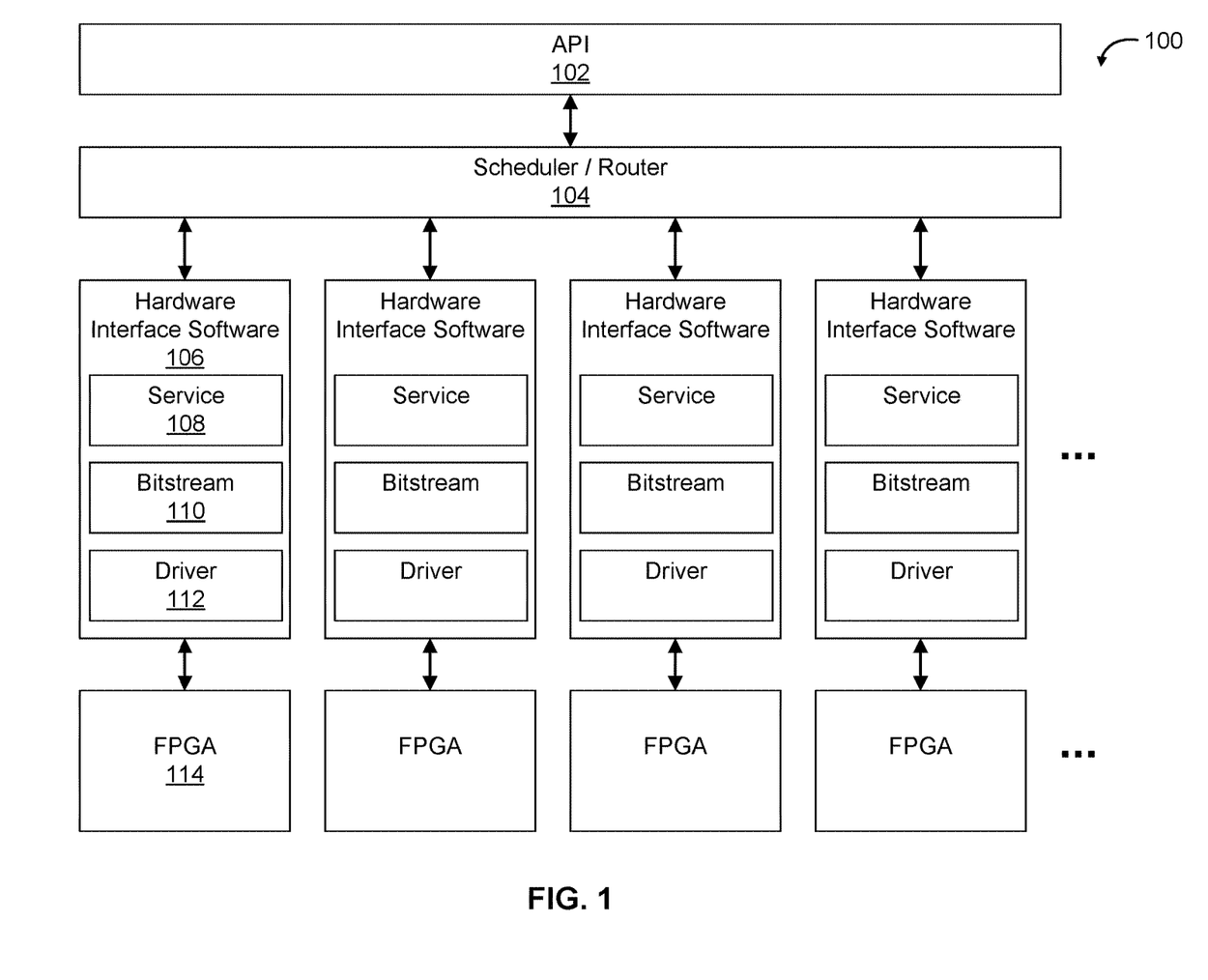
FIG. 1 is a block diagram illustrating an embodiment of an FPGA-based server system.

FIG. 1 is a block diagram illustrating an embodiment of an FPGA-based server system. In the example shown, server system 100 includes API 102, scheduler/router 104, a plurality of hardware interface software units (e.g., hardware interface software 106), and a plurality of FPGAs (e.g., FPGA 114). In the example shown, hardware interface software 106 includes service 108, bitstream 110, and driver 112. In the example shown, API 102, scheduler/router 104, and the hardware interface software units comprise server system 100's software layer, and the FPGAs comprise server system 100's hardware layer. Examples of software components in FIG. 1 (e.g., API 102, scheduler/router 104, service 108, bitstream 110, and driver 112) include any software system, component, process, and/or application.

In the example illustrated in FIG. 1, API 102 interfaces with scheduler/router 104. API 102 also interfaces with users/customers of server system 100. API 102 is where a compute request from a user is initially received, and API 102 is the user's interface for receiving a response/output data associated with the compute request. By using an API approach, FPGA capabilities can be presented to users via high-level programming languages. In some embodiments, API 102 is defined in the same way as traditional RPC models. Examples of RPC models include REST, Thrift, and gRPC. A customer program (customer in the sense of requesting services) of API 102 may send a request message to API 102 with appropriate arguments and data and then wait for a message containing the results of an executed compute on the data.

For example, with respect to GIF resizing, the customer program may send a desired resulting GIF size argument as well as a GIF image. The result returned would be a GIF image that is the desired resulting GIF size. Other examples of compute task requests that may be sent to API 102 include video encoding, natural language processing (NLP), artificial intelligence (AI) inference, complex arithmetic, model fitting, data compression, encryption, hashing, Fast Fourier Transform (FFT), and fuzzy logic hardware accelerator (FLHA) compute tasks, other image/video/audio related compute tasks, and any other compute tasks, particularly computationally intensive ones that would benefit from specialized hardware tailored to those tasks. API 102 can receive multiple types of requests. In various embodiments, scheduler/router 104 determines how the requests are handled.

In the example illustrated in FIG. 1, scheduler/router 104 interfaces with API 102. Scheduler/router 104 receives user compute requests passed on from API 102. Scheduler/router 104 also passes the results of compute task processing back to API 102. Scheduler/router 104 is configured to determine which FPGA resources are available to perform a compute task and which FPGA resources have been configured to handle which types of compute tasks. For example, if a GIF resizing request is received, scheduler/router 104 would be able to determine which FPGAs implement GIF resizing and the statuses of those FPGAs (e.g., available, occupied, etc.). In some embodiments, scheduler/router 104 assigns the compute task to a first available service associated with an FPGA implementing the relevant function. In some embodiments, scheduler/router 104 assigns the compute task to a service to commence performance of the compute task. If there are no currently available services associated with FPGAs implementing the relevant function, scheduler/router 104 may queue the compute task with an occupied service associated with an FPGA, choosing from among a plurality of services associated with FPGAs according to a metric (e.g., a load balancing metric).

In addition to load balancing considerations, scheduler/router 104 may also consider where FPGAs are physically located when assigning compute tasks. In some embodiments, FPGAs in server system 100 are located across different servers. In these embodiments, routing functionality of scheduler/router 104 may be used to route traffic to FPGAs on multiple servers. If all FPGAs in server system 100 are located on a single server, then no routing functionality is needed and scheduler/router 104 only requires scheduling functionality. If servers on which FPGAs reside are located in different server clusters, a higher-level routing architecture may be used.

Figure 2:
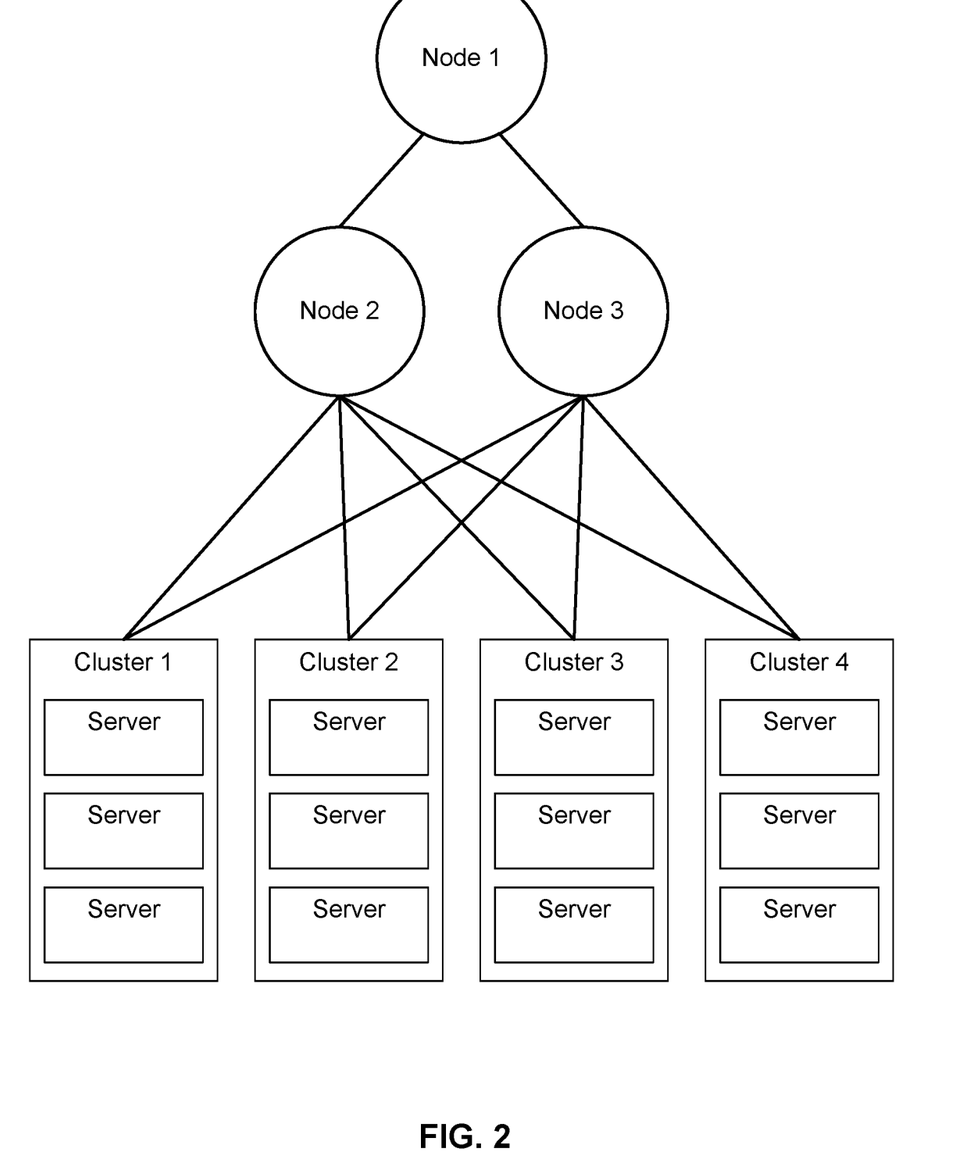
FIG. 2 illustrates an example network architecture in which servers (on which FPGAs reside) are located in different server clusters.

FIG. 2 illustrates an example network architecture in which servers (on which FPGAs reside) are located in different server clusters. In the example shown, servers (with FPGAs implementing various functions) are located in four server clusters. A master scheduler/router that interfaces with an API (e.g., API 102 of FIG. 1, API A 702 or API B 720 of FIG. 7, and API A 802 or API B 820 of FIG. 8) may be located in Node 1. In order to efficiently route traffic to the four server clusters, an additional routing layer (Node 2 and Node 3) may be added. In the example shown, this additional routing layer is fully interconnected with the server clusters (e.g., Node 2 and Node 3 have connections to all four of the server clusters). Node 2 and Node 3, as well as each server in each cluster, may include a scheduler/router that coordinates with the master scheduler/router and/or other schedulers/routers in the network architecture.

Returning to the example illustrated in FIG. 1, hardware interface software 106 serves as a communication conduit between scheduler/router 104 and FPGA 114. In the example shown, other hardware interface software/FPGA stacks in server system 100 also communicate with scheduler/router 104. As described above, FPGAs (and thus their associated hardware interface software) may be located on a single server, on different servers in a single server cluster, on different servers in different server clusters, etc. The various FPGAs implement various functions that a user could request, with the specific distribution of implemented functions across FPGAs based at least in part on demand for those functions. In various embodiments, when scheduler/router 104 assigns a compute task to an FPGA (e.g., FPGA 114), a request that is still in a software format (e.g., RPC format) is forwarded to hardware interface software (e.g., hardware interface software 106). The hardware interface software (e.g., hardware interface software 106) then converts the request into a format compatible with an FPGA (e.g., FPGA 114).

In the example illustrated in FIG. 1, hardware interface software 106 includes service 108, bitstream 110, and driver 112. Service 108 is software that decodes a request message (e.g., an RPC message) and sends it to FPGA 114 after the request message is converted by driver 112 into a format compatible with FPGA 114. Bitstream 110 is software that determines the function that FPGA 114 implements. This information is needed by scheduler/router 104 in order for scheduler/router 104 to match FPGAs with compute requests. In various embodiments, bitstream 110 and other bitstreams send information on what compute tasks FPGAs are configured to handle to scheduler/router 104. Driver 112 is software that structures the request message received by service 108 into a format that FPGA 114 can use to perform the requested compute task.

In various embodiments, after FPGA 114 performs the requested compute task, the results of the compute are transferred back to service 108. Service 108 then constructs an API response object to be sent back to scheduler/router 104, which then sends the response object back to API 102 and to the user. At this point, service 108 is ready to accept the next request for use of FPGA 114. Services are mapped one-to-one to FPGAs (e.g., service 108 mapped to FPGA 114). Stated alternatively, when a service is initialized, it is bound to an FPGA device. The FPGA is initially unprogrammed when it is powered on. In various embodiments, the service bound to the FPGA device reads an FPGA bitstream from persistent storage and transfers it to the FPGA, thus initializing the FPGA and making it ready to accept compute requests.

In the example illustrated in FIG. 1, FPGAs are the hardware resources that perform compute tasks. In various embodiments, the FPGAs are implemented as integrated circuits that include arrays of logic blocks that are programmable using a hardware description language (HDL). Examples of HDLs include VHDL and Verilog. The reprogrammable nature of FPGAs allows FPGAs the flexibility to be reconfigured to handle different specialized compute tasks as needed, which is not possible with other hardware technologies, such as ASICs. In addition, FPGAs can be much more efficient than CPUs because FPGAs can structure computation in a more parallel manner. For example, an FPGA that implements GIF resizing may be able to try 128-256 resize combinations at once because it can implement 128-256 resizing hardware cores instead of perhaps merely 4 resize combinations from a 4-core CPU.

In various embodiments, the initialization process for the system is as follows: power is applied and a host operating system loads, scheduler/router 104 is loaded, available FPGA resources are enumerated, and available service descriptions are loaded. At this point, FPGAs are powered down and unprogrammed. In various embodiments, the lifecycle of an FPGA includes being powered down, being powered up and programmed (with a service mapped to the FPGA), potentially being dynamically reconfigured, and being powered down again. Programming an FPGA requires a non-trivial amount of time. Thus, initial allocation of FPGAs to functions/algorithms performed by the FPGAs influences overall system performance. Examples of initial configuration strategies include: keeping all FPGAs powered down and unprogrammed (not allocated) until a first compute request is received, allocating a specified number of FPGAs before the first compute request (e.g., one FPGA per API), and allocating all FPGAs before the first compute request (e.g., allocated across APIs uniformly or according to a distribution based on use statistics).

In the example illustrated in FIG. 1, portions of the communication path between the components are shown. Other communication paths may exist, and the example of FIG. 1 has been simplified to illustrate the example clearly. Although single instances of components have been shown to simplify the diagram, additional instances of any of the components shown in FIG. 1 may exist. The number of components and the connections shown in FIG. 1 are merely illustrative. For example, more hardware interface software units and FPGAs may exist than what is shown. Components not shown in FIG. 1 may also exist. In addition, different hardware interface software unit/FPGA stacks may be located in different geographic locations, and the scheduler/router may implement multiple layers of scheduling/routing.

FIG. 2 illustrates an example network architecture in which servers (on which FPGAs reside) are located in different server clusters. FIG. 2 is discussed above with respect to the server system example of FIG. 1 and below with respect to the server system examples of FIG. 7 and FIG. 8.

Figure 3:
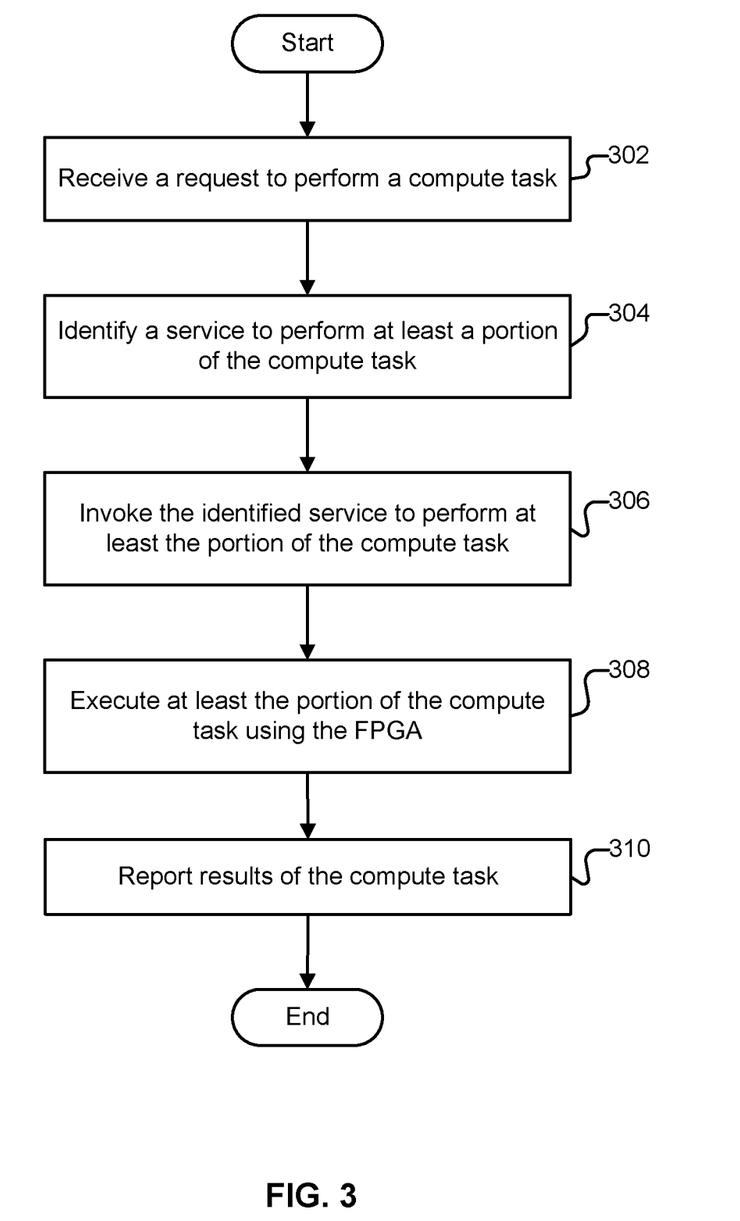
FIG. 3 is a flowchart illustrating an embodiment of a process for performing a compute task using an FPGA.

FIG. 3 is a flowchart illustrating an embodiment of a process for performing a compute task using an FPGA. In some embodiments, this process is performed by server system 100 of FIG. 1.

At 302, a request to perform a compute task is received. In some embodiments, the request originates from a customer/user that is exposed to an API endpoint (e.g., API 102 of FIG. 1). The customer/user may be a software program that invokes other ancillary software programs (e.g., via APIs). The customer/user software may request some type of compute task to return a compute result by making a function call to the API (e.g., making a library function call). In various embodiments, the customer/user does not have access to the implementation details associated with returning the compute result. For example, if the customer/user invokes a function, e.g., GIF_output=resizeGIF(GIF_input, result_size), the customer/user expects a new GIF image (GIF_output) that is resized from an initial GIF image (GIF_input) and resized to a new size (result_size). The customer/user may not have visibility into the compute resource that performs the processing (e.g., a CPU, an FPGA, etc.).

At 304, a service to perform at least a portion of the compute task is identified, wherein the identified service is associated with an FPGA that has been programmed to perform at least the portion of the compute task. In some embodiments, the identified service is a software interface associated with the FPGA (e.g., a hardware interface software unit in server system 100 of FIG. 1). The identified service is associated with a specified compute task that is to be executed on the FPGA. In some embodiments, a scheduler/router identifies the service from among many services (e.g., by comparing bitstreams associated with the services to determine which FPGAs implement which compute tasks). In some embodiments, identifying the service includes receiving the request to perform the compute task (e.g., an RPC message), identifying FPGAs that implement the compute task, considering resource management factors (e.g., load balancing) to determine a service to assign to execute the compute task, and sending a request to perform the compute task to the identified service.

At 306, the identified service is invoked to perform at least the portion of the compute task. In some embodiments, hardware interface software (e.g., hardware interface software of server system 100 of FIG. 1) receives a request to perform a compute task from a scheduling unit (e.g., scheduler/router 104 of FIG. 1). In some embodiments, the hardware interface software invokes an FPGA to perform at least the portion of the compute task. In some embodiments, invoking the identified service includes receiving a request message, decoding the request message, converting the request message into data in a hardware format, and sending the converted data to the hardware.

At 308, at least the portion of the compute task is executed using the FPGA. In some embodiments, one of the FPGAs in server system 100 of FIG. 1 executes the compute task. For example, if the compute task is to resize a GIF image, an FPGA in server system 100 of FPGA that has already been programmed to perform GIF resizing will receive data in the form of the original GIF image and a desired new GIF size (as extracted from an original request message received by a software component associated with the FPGA). The output of the FPGA is the output of the compute task (e.g., a resized GIF image), which is ultimately reported back to the requestor of the compute task.

At 310, results of the compute task are reported. In various embodiments, reporting results of the compute task to the requestor of the compute task is the reverse process of forwarding a request for the compute task from the requestor to the FPGA executing the compute task. In some embodiments, reporting the results of the compute task includes transferring result data from the FPGA to the service associated with the FPGA, constructing an API response object, and forwarding the API response object up to the requestor of the compute task.

Figure 4:
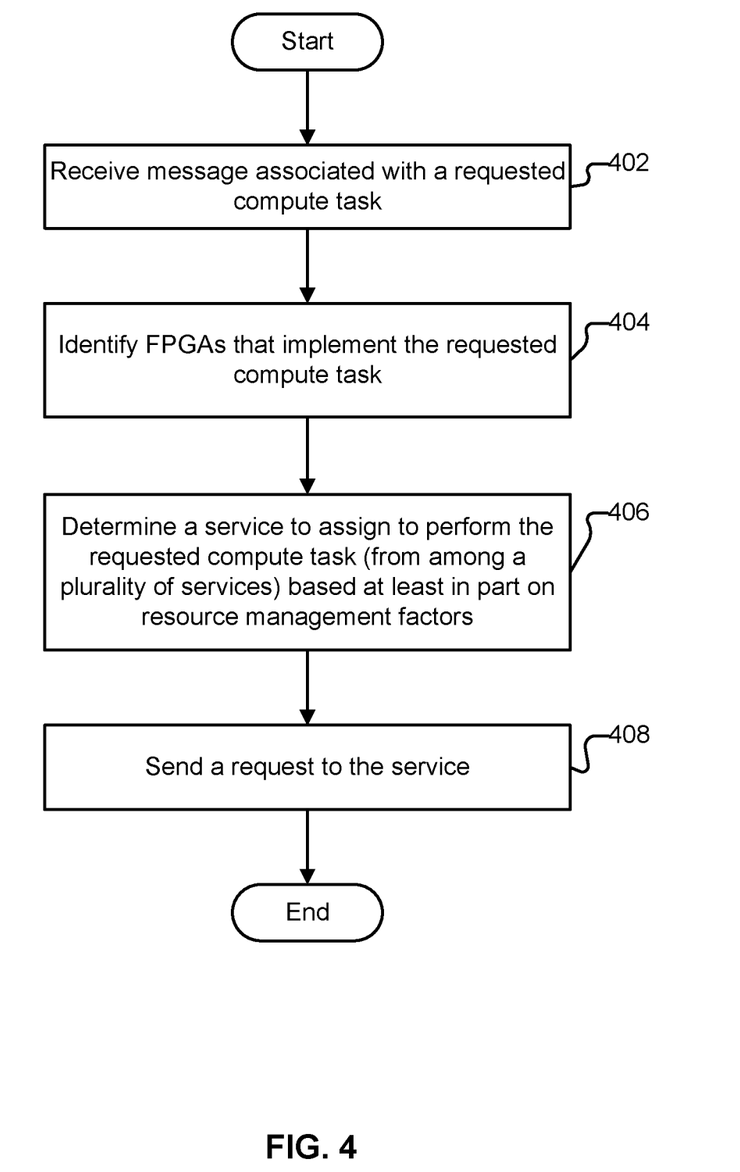
FIG. 4 is a flowchart illustrating an embodiment of a process for identifying a service to perform at least a portion of a compute task.

FIG. 4 is a flowchart illustrating an embodiment of a process for identifying a service to perform at least a portion of a compute task. In various embodiments, the service is identified from among a plurality of services, and each service is associated one-to-one with an FPGA that has been programmed to perform at least the portion of the compute task. In some embodiments, the process of FIG. 4 is performed by scheduler/router 104 of FIG. 1. In some embodiments, at least a portion of the process of FIG. 4 is performed in 304 of FIG. 3.

At 402, a message associated with a requested compute task is received. For example, the message may be an RPC message associated with a compute task function call sent by a customer/user of an API (e.g., API 102 of FIG. 1). A function with parameters and data (e.g., GIF_output=resizeGIF(GIF_input, result_size)) may be called. In various embodiments, the function call is encoded into a message format (e.g., RPC message) that is received by a scheduler/router (e.g., scheduler/router 104 of FIG. 1). For example, an RPC message with input data (e.g., original GIF image) and input parameters (e.g., desired resulting GIF size) encoded into the RPC message can be created.

At 404, FPGAs that implement the requested compute task are identified. For example, in server system 100 of FIG. 1, the various FPGAs in the server system implement various compute tasks (e.g., some may implement GIF resizing, others may implement video encoding tasks, audio encoding tasks, natural language processing tasks, encryption tasks, and so forth). In some embodiments, bitstream information indicating the compute task each FPGA implements is sent from hardware interface software (e.g., bitstream 110 of FIG. 1) to scheduler/router 104 of FIG. 1. From the bitstream information, the FPGAs that implement the requested compute task can be identified.

At 406, a service to assign to perform the requested compute task is determined based at least in part on resource management factors. For example, if a first service and a second service are associated with FPGAs that implement GIF resizing and the first service is currently occupied (FPGA occupied) but the second service is idle (FPGA not occupied), a resource management strategy may be to assign the requested compute task to the second service. If both the first service and the second service are occupied, load balancing may be considered. For example, both the first service and the second service may have queues of already assigned tasks, in which case the service with the shortest queue may be assigned to perform the requested compute task (e.g., the requested compute task is added to the shorter queue).

At 408, a request to the service is sent. If the service is already processing another request, the request that is sent to the service may be queued with the service (e.g., queued to be sent to hardware resources as they become available). Alternatively, the request may be queued before being sent to a service (e.g., queued with scheduler/router 104 of FIG. 1) and released from the queue to the service when the service and the hardware resource associated with the service become available.

Figure 5:
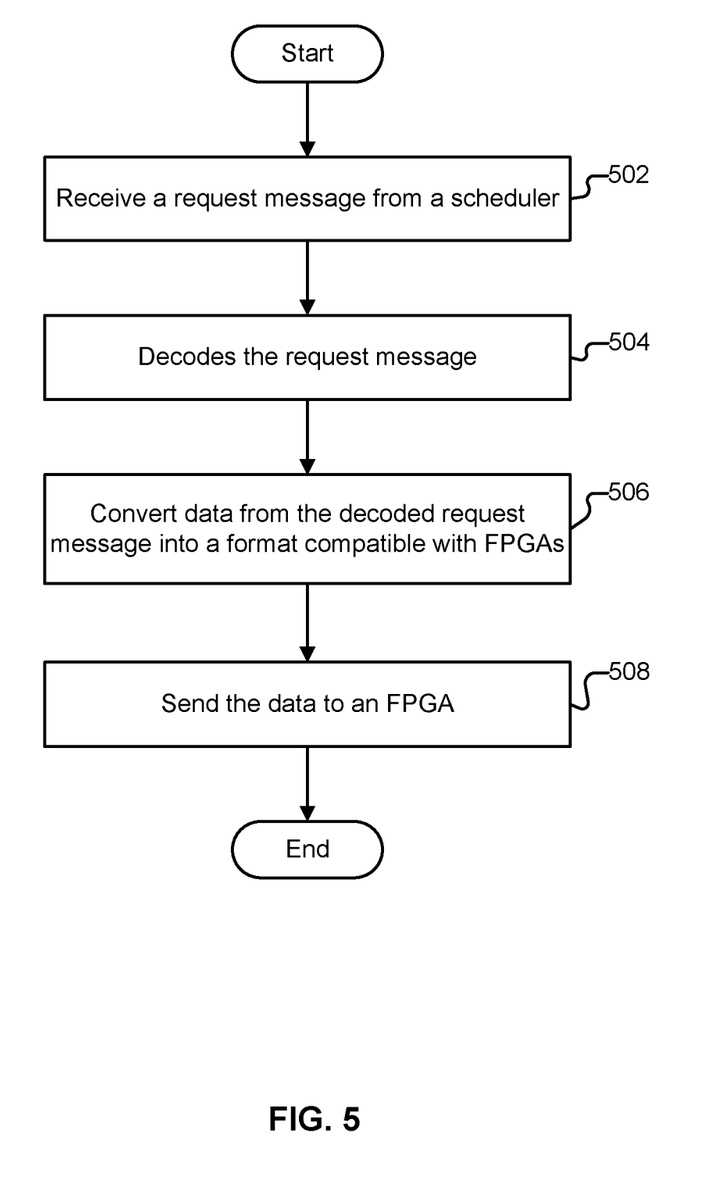
FIG. 5 is a flowchart illustrating an embodiment of a process for invoking a service to perform at least a portion of a compute task.

FIG. 5 is a flowchart illustrating an embodiment of a process for invoking a service to perform at least a portion of a compute task. In some embodiments, the process of FIG. 5 is performed by hardware interface software (e.g., hardware interface software 106 of FIG. 1 or another hardware interface software unit of server system 100 of FIG. 1). In some embodiments, at least a portion of the process of FIG. 5 is performed in 306 of FIG. 3.

At 502, a request message is received from a scheduler. In some embodiments, the scheduler is scheduler/router 104 of FIG. 1. In some embodiments, the request message is a forwarded RPC message associated with a compute task function call originally sent by a customer/user of an API (e.g., API 102 of FIG. 1). The request message includes data and parameters associated with the compute task (e.g., in an encoded format). For example, in the case of GIF resizing, an RPC message includes input data (e.g., original GIF image) and input parameters (e.g., desired resulting GIF size). In some embodiments, the request message is received by a service (e.g., service 108 or another service associated with a hardware interface software unit of server system 100 of FIG. 1). In some embodiments, the service queues the request until an FPGA to perform the compute task is ready to begin the compute task.

At 504, the request message is decoded. In some embodiments, the request message is decoded by a service (e.g., service 108 or another service associated with a hardware interface software unit of server system 100 of FIG. 1). For example, an RPC message associated with a GIF resizing compute task may be decoded by extracting the GIF data (original GIF image) and desired resulting GIF size parameter. The decoding may be performed by keeping only the portions of the message including the desired data (e.g., ignoring message headers and other metadata). This may be accomplished by the service determining the structure of the request message from a header portion or the service already knowing the structure when it receives the request message.

At 506, data from the decoded request message is converted into a format compatible with FPGAs. In some embodiments, a driver (e.g., driver 112 or another driver associated with a hardware interface software unit of server system 100 of FIG. 1) converts the data from the decoded request message into a format compatible with FPGAs. The format of the data (e.g., image data, numeric parameter values, etc.) to be sent to an FPGA depends on the format the FPGA is expecting for a specified compute task. For example, an FPGA that implements GIF resizing may expect GIF image data in a certain row and column format. In addition, the FPGA may expect numeric data (e.g., GIF pixel values and desired resulting image dimensions) in a specific numeric format (e.g., binary, decimal, hexadecimal, etc.).

At 508, the data is sent to an FPGA. In some embodiments, the data is sent on a bus (e.g., wire, optical, fiber, etc.). The data may be sent using a serial connection, parallel connection, etc.

Figure 6:
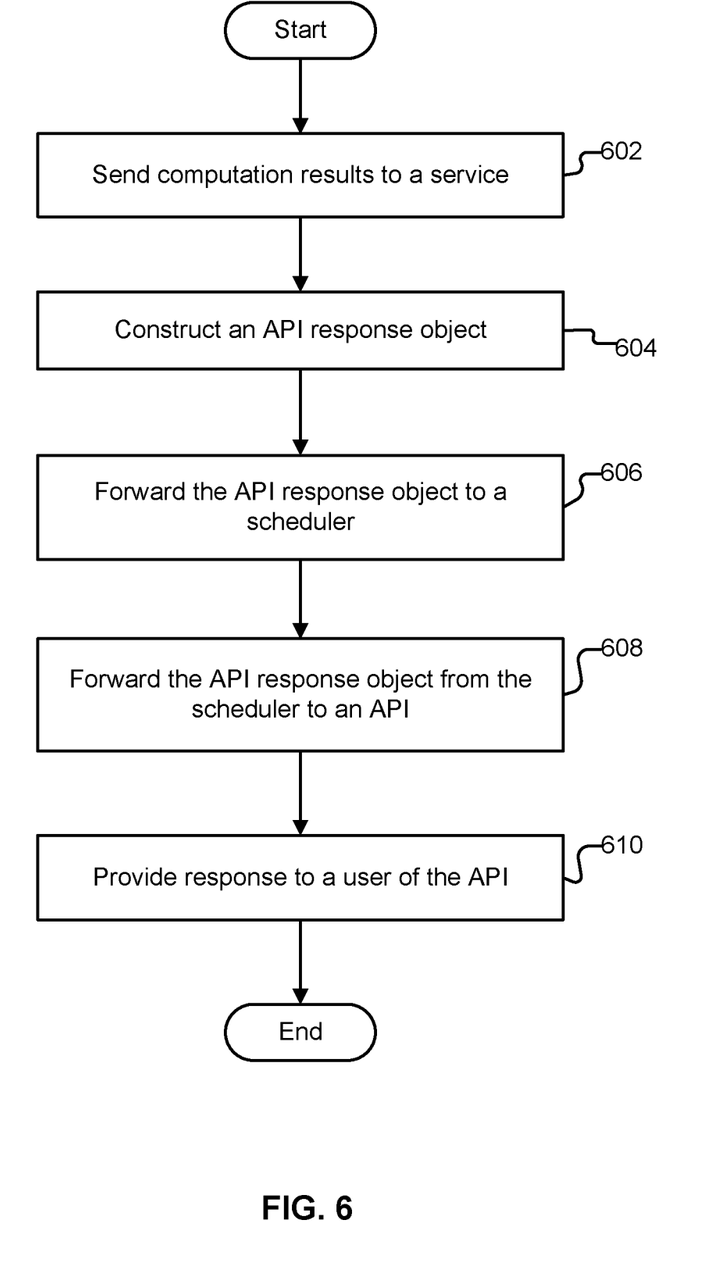
FIG. 6 is a flowchart illustrating an embodiment of a process for reporting results of a compute task.

FIG. 6 is a flowchart illustrating an embodiment of a process for reporting results of a compute task. In some embodiments, the process of FIG. 6 is performed by server system 100 of FIG. 1. In some embodiments, at least a portion of the process of FIG. 6 is performed in 310 of FIG. 3.

At 602, computation results are sent to a service. For example, computation results from FPGA 114 of FIG. 1 may be sent to service 108 of FIG. 1. In some embodiments, this is the reverse of step 508 in FIG. 5 in which input data is sent from the service to the FPGA.

At 604, an API response object is constructed. In some embodiments, this is performed by the service that receives the computation results. For example, service 108 in FIG. 1 may encode the computation results (e.g., a resized GIF image) into an API object that can serve as a response to an RPC message. In some embodiments, this is the reverse of steps 504 and 506 in FIG. 5 in which a request message (e.g., an RPC message) is decoded and converted into a format compatible with FPGAs.

At 606, the API response object is forwarded to a scheduler. In some embodiments, the scheduler is scheduler/router 104 of FIG. 1. In various embodiments, the API response object is forwarded to the scheduler because the scheduler is the link to where the request to perform the compute task originated. In some embodiments, the request to perform the compute task originated from a user making a call to an API (e.g., API 102 of FIG. 1).

At 608, the API response object is forwarded from the scheduler to an API. The API (e.g., API 102 of FIG. 1) that receives the API response object is the API that initially received a call from a user to perform a compute task and converted the user's call to a request message (e.g., RPC message) sent to a service associated with an FPGA.

At 610, a user of the API is given a response. In various embodiments, the API gives the response to the user in the format the user is expecting. For example, if the user made a GIF resizing call, such as GIF_output=resizeGIF (GIF_input, result_size), to the API, the API would need to return to the user GIF_output (e.g., a new GIF image). The API can extract the data that needs to be returned from the API response object. In various embodiments, a result is returned to the API caller as though the computation had occurred in place locally (without the user being aware of any RPC message sent to an FPGA-based server system).

Figure 7:
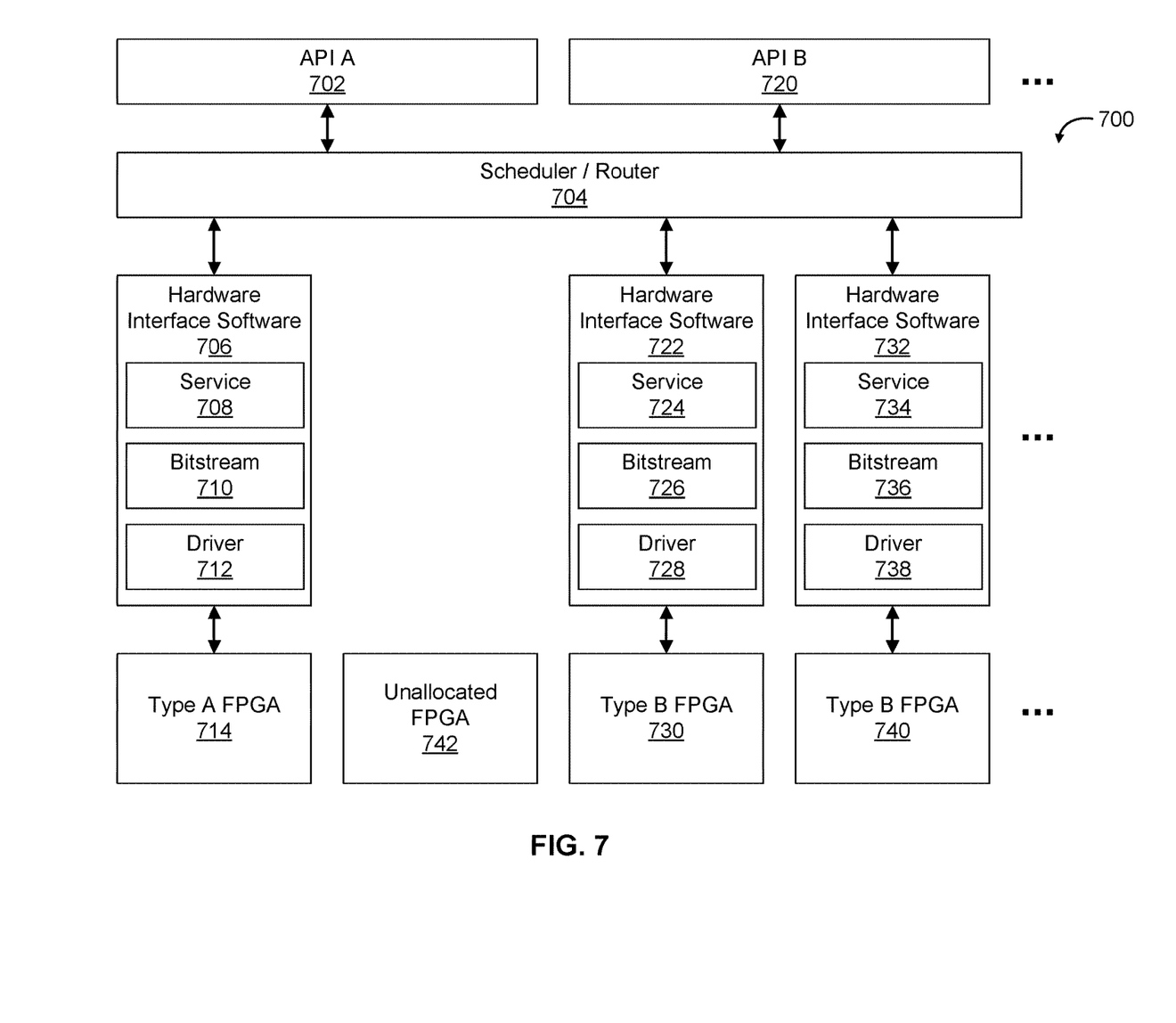
FIG. 7 is a block diagram illustrating an embodiments of an FPGA-based server system that dynamically allocates resources to perform a variety of compute tasks.

FIG. 7 is a block diagram illustrating an embodiments of an FPGA-based server system that dynamically allocates resources to perform a variety of compute tasks. In the example shown, server system 700 includes API A 702, scheduler/router 704, hardware interface software units 706, 722, and 732, Type A FPGA 714, Type B FPGAs 730 and 740, and Unallocated FPGA 742. Server system 700 can be viewed as an extension of server system 100 of FIG. 1. In the example shown, each hardware interface software unit includes a service, bitstream, and driver. Each hardware interface software unit is mapped to an FPGA type and an API type. For example, hardware interface software 706 is mapped to API A 702 and Type A FPGA 714. If API A 702 receives a certain type of function call (e.g., resizing GIFs), hardware interface software 706 is configured to handle that type of function call and Type A FPGA 714 is configured to implement that type of function call (e.g., resizing GIFs). This means that service 708, bitstream 710, and driver 712 are configured to handle that type of function call (e.g., resizing GIFs).

In the example shown, API B 720 would receive a different type of function call. In the example shown, Type B FPGAs 730 and 740 implement the function associated with API B 720 and hardware interface software units 722 and 732 are configured for the function call associated with API B 720 and Type B FPGAs 730 and 740. In the example shown, Unallocated FPGA 742 does not implement a function associated with API A 702 or API B 720 (e.g., Unallocated FPGA 742 may be unprogrammed). In various embodiments, when Unallocated FPGA 142 is allocated for a specific type of compute task, hardware interface software is then mapped to Unallocated FPGA 742. For example, if Unallocated FPGA 742 is programmed to implement the same function as Type A FPGA 714, Unallocated FPGA 742 would be mapped to a hardware interface software unit identical to hardware interface software 706.

In the example illustrated in FIG. 7, different APIs are exposed to users for different compute requests. It is also possible to instead use a single API that is configured to receive a variety of compute requests. A plurality of scheduler/routers may be used with this single API approach. For example, the single API (e.g., an API gateway) may forward compute requests to schedulers/routers mapped to FPGA resources based on what functions the FPGAs implement. Stated alternatively, each scheduler/router may be configured to handle queuing, data transfer to/from FPGAs, and communication with the API gateway for one type of compute task. It is also possible to use a single scheduler/router with a single API. In this scenario, the single scheduler/router determines where compute requests are sent based on its knowledge of which FPGAs implement which functions. This information about the FPGAs may be communicated to the scheduler/router as bitstream information from services mapped to the FPGAs. It is also possible for different APIs to be exposed for different compute tasks and use a dedicated scheduler/router for each API. In all of these scenarios, there is a defined API endpoint for receiving multiple types of compute requests and a mechanism for directing these compute requests to the appropriate FPGA resources.

In the example shown, API A 702, API B 720, scheduler/router 704, and the hardware interface software units comprise server system 700's software layer, and the FPGAs comprise server system 700's hardware layer. Examples of software components in FIG. 7 (e.g., API A 702, scheduler/router 704, service 708, bitstream 710, and driver 712) include any software system, component, process, and/or application.

In the example illustrated in FIG. 7, API A 702 and API B 720 interface with scheduler/router 704. API A 702 and API B 720 also interface with users/customers of server system 700. API A 702 and API B 720 are where a compute request from a user is initially received and they are the user's interface for receiving a response/output data associated with the compute request. By using an API approach, FPGA capabilities can be presented to users via high-level programming languages. In some embodiments, APIs are defined in the same way as traditional RPC models. Examples of RPC models include REST, Thrift, and gRPC. A customer program (customer in the sense of requesting services) of API A 702 or API B 720 may send a request message to API A 702 or API B 720 with appropriate arguments and data and then wait for a message containing the results of an executed compute on the data.

For example, with respect to GIF resizing, the customer program may send a desired resulting GIF size argument and as well as a GIF image. The result returned would be a GIF image that is the desired resulting GIF size. Other examples of compute task requests include video encoding, natural language processing (NLP), artificial intelligence (AI) inference, complex arithmetic, model fitting, data compression, encryption, hashing, Fast Fourier Transform (FFT), and fuzzy logic hardware accelerator (FLHA) compute tasks, other image/video/audio related compute tasks, and any other compute tasks, particularly computationally intensive ones that would benefit from specialized hardware tailored to those tasks. In various embodiments, scheduler/router 704 determines how the requests are handled.

In various embodiments, a function repository (e.g., implementing the above functions) is available to nodes for dynamic provisioning in which objects contain bitstreams and characteristic metadata. Based on geographical load and resources, the repository of functions may be uniquely tailored. In various embodiments, when a service is initialized, it is bound to one of the FPGA devices attached to the system, the FPGA is initially un-programmed, and the service reads an FPGA bitstream from persistent storage and transfers it to the corresponding FPGA to make the service ready to accept requests.

In the example illustrated in FIG. 7, scheduler/router 704 interfaces with API A 702 and API B 720. Scheduler/router 704 receives user compute requests passed on from an API. Scheduler/router 704 also passes the results of compute task processing back to the requesting API. Scheduler/router 704 is configured to determine which FPGA resources are available to perform a compute task and which FPGA resources have been configured to handle which types of compute tasks. For example, if a GIF resizing request is received, scheduler/router 704 would be able to determine which FPGAs implement GIF resizing and the statuses of those FPGAs (e.g., available, occupied, etc.). In some embodiments, scheduler/router 704 assigns the compute task to a first available FPGA implementing the relevant function. If there are no currently available FPGAs implementing the relevant function, scheduler/router 704 may queue the compute task with an occupied FPGA, choosing from among a plurality of FPGAs according to a metric (e.g., a load balancing metric).

In addition to load balancing considerations, scheduler/router 704 may also consider where FPGAs are located when assigning compute tasks. In some embodiments, FPGAs in server system 700 are located across different servers. In these embodiments, routing functionality of scheduler/router 704 may be used to route traffic to FPGAs on multiple servers. If all FPGAs in server system 700 are located on a single server, then no routing functionality is needed and scheduler/router 704 only requires scheduling functionality. If servers on which FPGAs reside are located in different server clusters, a higher-level routing architecture (e.g., as shown in FIG. 2) may be used.

In the example illustrated in FIG. 7, hardware interface software 706 serves as a communication conduit between scheduler/router 704 and Type A FPGA 714. In the example shown, other hardware interface software/FPGA stacks in server system 700 also communicate with scheduler/router 704. As described above, FPGAs (and thus their associated hardware interface software) may be located on a single server, on different servers in a single server cluster, on different servers in different server clusters, etc. The various FPGAs implement various functions that a user could request, with the specific distribution of implemented functions across FPGAs based at least in part on demand for those functions. In various embodiments, when scheduler/router 704 assigns a compute task to an FPGA (e.g., FPGA 714), a request that is still in a software format (e.g., RPC format) is forwarded to hardware interface software (e.g., hardware interface software 706). The hardware interface software (e.g., hardware interface software 706) then converts the request into a format compatible with an FPGA (e.g., Type A FPGA 714).

In the example illustrated in FIG. 7, hardware interface software units include a service, bitstream, and driver. For example, hardware interface software 706 includes service 708, bitstream 710, and driver 712. Service 708 is software that decodes a request message (e.g., an RPC message) and sends it to Type A FPGA 714 after the request message is converted by driver 712 into a format compatible with Type A FPGA 714. Bitstream 710 is software that determines the function that Type A FPGA 714 implements. This information is needed by scheduler/router 704 in order for scheduler/router 704 to match FPGAs with compute requests. In various embodiments, bitstream 710 and other bitstreams send information on what compute tasks FPGAs are configured to handle to scheduler/router 704. Driver 712 is software that structures the request message received by service 708 into a format that Type A FPGA 714 can use to perform the requested compute task. The components of hardware interface software 722 and 732 perform the above for Type B FPGAs 730 and 740, respectively.

In various embodiments, after an FPGA (e.g., Type A FPGA 714 and Type B FPGAs 730 and 740) performs the requested compute task, the results of the compute are transferred back to the corresponding service, which then constructs an API response object to be sent back to scheduler/router 704, which then sends the response object back to API 702 and to the user. At this point, the service is ready to accept the next request for use of the FPGA. Services are mapped one-to-one to FPGAs (e.g., service 708 mapped to Type A FPGA 714). Stated alternatively, when a service is initialized, it is bound to an FPGA device. The FPGA is initially unprogrammed when it is powered on. In various embodiments, the service bound to the FPGA device reads an FPGA bitstream from persistent storage and transfers it to the FPGA, thus initializing the FPGA and making it ready to accept compute requests. FIGS. 3-6 provide additional details associated with performing a compute task using an FPGA, from identifying a service to perform a compute task to invoking the service to reporting results of the compute task.

In the example illustrated in FIG. 7, FPGAs are the hardware resources that perform compute tasks. In various embodiments, the FPGAs are implemented as integrated circuits that include arrays of logic blocks that are programmable using a hardware description language (HDL). Examples of HDLs include VHDL and Verilog. The reprogrammable nature of FPGAs allows FPGAs the flexibility to be reconfigured to handle different specialized compute tasks as needed, which is not possible with other hardware technologies, such as ASICs. In addition, FPGAs can be much more efficient than CPUs because FPGAs can structure computation in a more parallel manner. For example, an FPGA that implements GIF resizing may be able to try 128-256 resize combinations at once because it can implement 128-256 resizing hardware cores instead of perhaps merely 4 resize combinations from a 4-core CPU.

In various embodiments, the initialization process for the system is as follows: power is applied and a host operating system loads, scheduler/router 704 is loaded, available FPGA resources are enumerated, and available service descriptions are loaded. At this point, FPGAs are powered down and unprogrammed. In various embodiments, the lifecycle of an FPGA includes being powered down, being powered up and programmed (with a service mapped to the FPGA), potentially being dynamically reconfigured, and being powered down again. Programming an FPGA requires a non-trivial amount of time. Thus, initial allocation of FPGAs to functions/algorithms performed by the FPGAs influences overall system performance. Examples of initial configuration strategies include: keeping all FPGAs powered down and unprogrammed (not allocated) until a first compute request is received, allocating a specified number of FPGAs before the first compute request (e.g., one FPGA per API), and allocating all FPGAs before the first compute request (e.g., allocated across APIs uniformly or according to a distribution based on use statistics).

Scheduler/router 704 may also allocate or reallocate an unallocated FPGA to perform a specified compute task that is in high demand. For example, Unallocated FPGA 742 may be allocated, in which case hardware interface software (e.g., a service, bitstream, and driver) would be instantiated and mapped to Unallocated FPGA 742. The function/algorithm Unallocated FPGA 742 is assigned to perform can depend on a variety of utilization metrics. Similarly, the function/algorithm an already allocated FPGA is reassigned to perform can depend on similar utilization metrics.

Utilization metrics can be associated with queues of incoming requests for FPGAs. Queue depth can be used as a metric for reallocating resources. For example, if one group of FPGAs that implements one particular function has a higher queue depth, then FPGAs whose implemented functions have lower queue depths can be allocated/reallocated toward the FPGAs that implement the function with the higher queue depth. Stated alternatively, FPGA resources can be allocated/reallocated to balance queue depths. Execution time can also be used as a metric for reallocating resources. For example, if one group of FPGAs that implements one particular function is experiencing longer execution times (e.g., taking longer to complete compute task requests) than other groups of FPGAs, then FPGA resources can be allocated/reallocated to the FPGAs that implement the function experiencing longer execution times.

Cost functions that take into account multiple metrics, such as queue depth, execution time, and other metrics, can be constructed and used (e.g., by giving each of the metrics weights or using them in formulas). For example, execution time may be multiplied with queue depth. Thus, compute tasks associated with a queue that is twice as long but execute in half the time would be as costly as compute tasks associated with a queue that is four times as long but execute in a quarter of the time. Reprogramming time for FPGAs can also be taken into account (e.g., reallocation may not be favored if the reprogramming time cost outweighs benefits of reallocation. Reprogramming time may vary for different FPGA bitstreams (e.g., some functions/algorithms may be associated with larger bitstreams and thus longer reprogramming time).

Time of day and time zone may be used as factors that affect allocation/reallocation of resources. For example, more FPGA resources may be allocated/reallocated during peak use periods. FPGA resources may be reallocated based on current events. For example, more FPGA resources may be reallocated to implement GIF resizing during active social media periods, e.g., during a Super Bowl or other major sporting event. Service-level requirements (e.g., maximum response time) can also affect whether resources are reallocated. For example, reallocation of FPGA resources may be disallowed if it would cause a service requirement to be violated. In addition, if a service is predicted to not meet a requirement, reallocation of additional resources to help meet demand may be triggered.

In various embodiments, utilization metrics are evaluated to dynamically identify a reallocation of an identified FPGA resource to handle a selected eligible compute task. In various embodiments, utilization metrics are tracked. For example, the number of times a function/service is called can be tracked. This may be used to determine initial allocation of FPGA resources (e.g., preloading FPGAs) as well as for dynamic reallocation of FPGA resources. Queue depth and execution time can also be tracked. This may be used to calculate and evaluate cost functions associated with different groups of FPGAs associated with different eligible compute tasks. For example, a first eligible compute task may be associated with a cost function value that is twice that of a second eligible compute task. In this scenario, FPGA resources may be identified to dynamically reallocate from a group of FPGAs performing the second eligible compute task to a group of FPGAs performing the first eligible compute task.

With respect to initial allocation of FPGA resources (e.g., preloading FPGAs), a scheduler router (e.g., scheduler/router 704 of FIG. 7) will have a mapping of API requests to bitstreams (represented as services). The scheduler/router can keep track of statistics on the types of requests that have been serviced, predict demand based on the statistics, and preload some FPGAs before requests are received. For functions/algorithms without a preloaded FPGA, when a service associated with a function/algorithm is launched to handle a request for that function/algorithm, the service can connect to the FPGA and upload a bitstream for that FPGA. For this reason, the first use of an FPGA may be associated with a relatively long setup time.

An identified FPGA resource can be automatically reprogrammed to handle a selected eligible compute task. In various embodiments, reprogramming of the FPGA includes mapping the FPGA to a new service associated with the selected eligible compute task. For example, in the server system of FIG. 7, this may include assigning the FPGA a new hardware interface software unit. In this scenario, if the FPGA is being reprogrammed to implement the compute task of Type A FPGA 714 of FIG. 7, the FPGA would need hardware interface software identical to hardware interface software 706 of FIG. 7. In various embodiments, reprogramming the FPGA includes a service reading an FPGA bitstream from persistent storage and transferring it to the FPGA, thereby overwriting a prior bitstream, after which the service is ready to accept requests for the selected eligible compute task to be performed by the FPGA In the example illustrated in FIG. 7, portions of the communication path between the components are shown. Other communication paths may exist, and the example of FIG. 7 has been simplified to illustrate the example clearly. Although single instances of components have been shown to simplify the diagram, additional instances of any of the components shown in FIG. 7 may exist. The number of components and the connections shown in FIG. 7 are merely illustrative. For example, more APIs, hardware interface software units, and FPGAs may exist than what is shown. As described above, implementations with a single API gateway and/or multiple scheduler/router units are also possible. In addition, different hardware interface software unit/FPGA stacks may be located in different geographic locations, and the scheduler/router may implement multiple layers of scheduling/routing.

Figure 8:
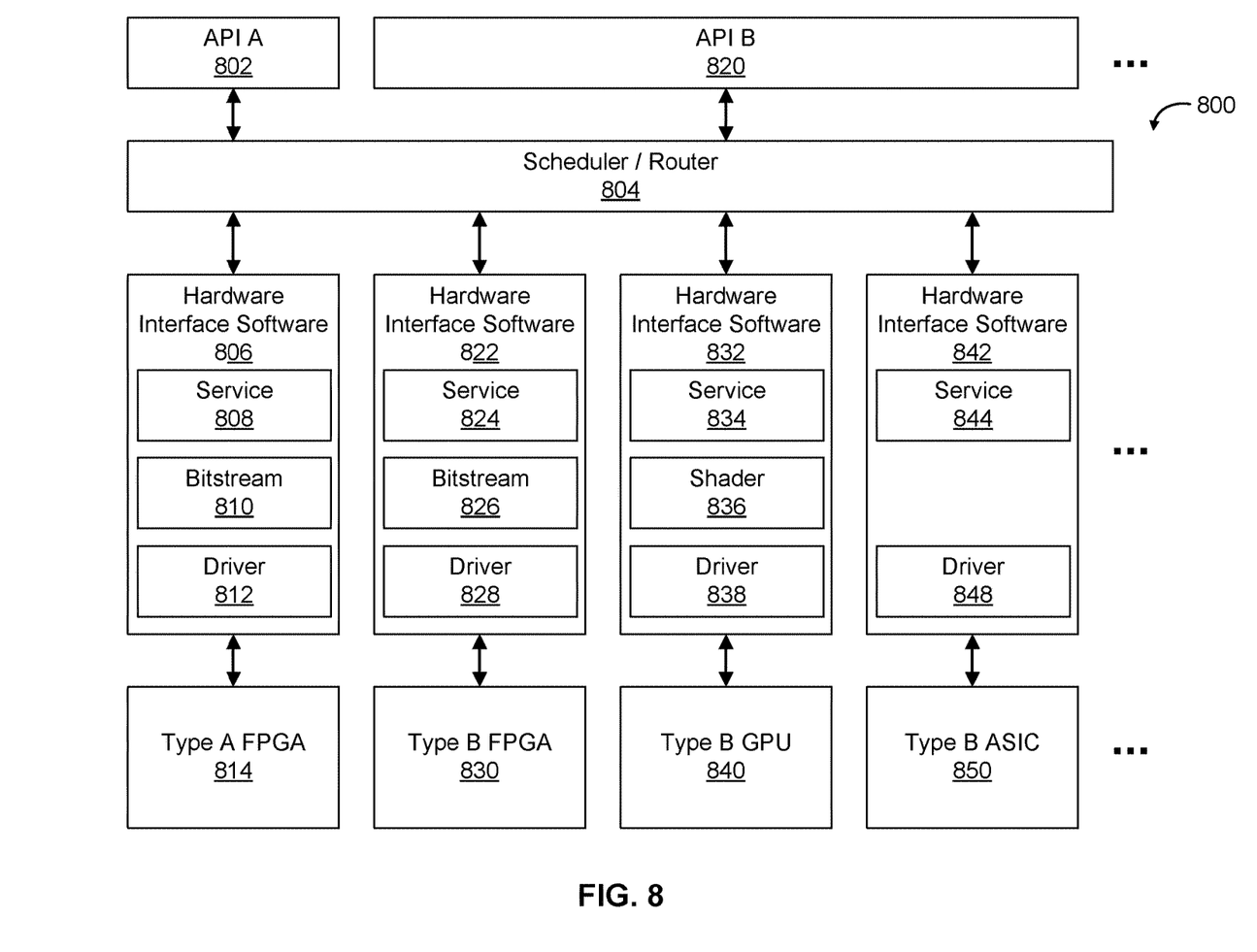
FIG. 8 is a block diagram illustrating an embodiment of a server system that includes a plurality of compute processor resources.

FIG. 8 is a block diagram illustrating an embodiment of a server system that includes a plurality of compute processor resources. In the example shown, server system 800 includes API A 802, API B 820, scheduler/router 804, hardware interface software units 806, 822, 832, and 842, Type A FPGA 814, Type B FPGA 830, Type B GPU 840, and Type B ASIC 850. In the example shown, each hardware interface software unit includes a service. Hardware interface software for FPGAs include a bitstream and driver. Hardware interface software for GPUs include a shader and driver. Hardware interface software for ASICs include a driver. Each hardware interface software unit is mapped to a compute processor resource (e.g., FPGA, GPU, ASIC, etc.) and an API type. For example, hardware interface software 806 is mapped to API A 802 and Type A FPGA 814. If API A 802 receives a certain type of function call (e.g., resizing GIFs), hardware interface software 806 is configured to handle that type of function call and Type A FPGA 814 is configured to implement that type of function call (e.g., resizing GIFs). This means that service 808, bitstream 810, and driver 812 are configured to handle that type of function call (e.g., resizing GIFs).

In the example shown, API B 820 would receive a different type of function call. In the example shown, Type B FPGA 830, Type B GPU 840, and Type B ASIC 850 implement the function associated with API B 820 and hardware interface software units 822, 832, and 842 are configured for the function call associated with API B 820.

In the example illustrated in FIG. 8, different APIs are exposed to users for different compute requests. It is also possible to instead use a single API that is configured to receive a variety of compute requests. A plurality of scheduler/routers may be used with this single API approach. For example, the single API (e.g., an API gateway) may forward compute requests to schedulers/routers mapped to compute processor resources based on what functions the compute processor resources implement. Stated alternatively, each scheduler/router may be configured to handle queuing, data transfer to/from compute processor resources, and communication with the API gateway for one type of compute task. It is also possible to use a single scheduler/router with a single API. In this scenario, the single scheduler/router determines where compute requests are sent based on its knowledge of which compute processor resources implement which functions. This information about the compute processor resources may be communicated to the scheduler/router as information from services mapped to the compute processor resources. It is also possible for different APIs to be exposed for different compute tasks and use a dedicated scheduler/router for each API. In all of these scenarios, there is a defined API endpoint for receiving multiple types of compute requests and a mechanism for directing these compute requests to the appropriate compute processor resources.

In the example shown, API A 802, API B 820, scheduler/router 804, and the hardware interface software units comprise server system 800's software layer, and the compute processor resources (Type A FPGA 814, Type B FPGA 830, Type B GPU 840, and Type B ASIC 850) comprise server system 800's hardware layer. Examples of software components in FIG. 8 (e.g., API A 802, scheduler/router 804, service 808, bitstream 810, and driver 812) include any software system, component, process, and/or application. The example shown is illustrative and not restrictive. Additional hardware interface software units and compute processor resources may be present. CPUs (not shown in this example) may also be present.

In the example illustrated in FIG. 8, API A 802 and API B 820 interface with scheduler/router 804. API A 802 and API B 820 also interface with users/customers of server system 800. API A 802 and API B 820 are where a compute request from a user is initially received and they are the user's interface for receiving a response/output data associated with the compute request. By using an API approach, compute processor resource capabilities can be presented to users via high-level programming languages. In some embodiments, APIs are defined in the same way as traditional RPC models. Examples of RPC models include REST, Thrift, and gRPC. A customer program (customer in the sense of requesting services) of API A 802 or API B 820 may send a request message to API A 802 or API B 820 with appropriate arguments and data and then wait for a message containing the results of an executed compute on the data.

For example, with respect to GIF resizing, the customer program may send a desired resulting GIF size argument as well as a GIF image. The result returned would be a GIF image that is the desired resulting GIF size. Other examples of compute task requests include video encoding, natural language processing (NLP), artificial intelligence (AI) inference, complex arithmetic, model fitting, data compression, encryption, hashing, Fast Fourier Transform (FFT), and fuzzy logic hardware accelerator (FLHA) compute tasks, other image/video/audio related compute tasks, and any other compute tasks. In various embodiments, scheduler/router 104 determines how the requests are handled.

In various embodiments, a function repository (e.g., implementing the above functions) is available to FPGA nodes for dynamic provisioning in which objects contain bitstreams and characteristic metadata. Based on geographical load and resources, the repository of functions may be uniquely tailored. In various embodiments, when an FPGA service is initialized, it is bound to one of the FPGA devices attached to the system, the FPGA is initially unprogrammed, and the service reads an FPGA bitstream from persistent storage and transfers it to the corresponding FPGA to make the service ready to accept requests.

In the example illustrated in FIG. 1, scheduler/router 804 interfaces with API A 802 and API B 820. Scheduler/router 804 receives user compute requests passed on from an API. Scheduler/router 804 also passes the results of compute task processing back to the requesting API. Scheduler/router 804 is configured to determine which compute processor resources are available to perform a compute task and which compute processor resources have been configured to handle which types of compute tasks. For example, if a GIF resizing request is received, scheduler/router 804 would be able to determine whether FPGAs, ASICs, GPUs, CPUs, etc. implement GIF resizing and which specific compute processor resources implement GIF resizing and the statuses of those compute processor resources (e.g., available, occupied, etc.). In some embodiments, scheduler/router 804 assigns the compute task to a first available compute processor resource implementing the relevant function. If there are no currently available compute processor resources implementing the relevant function, scheduler/router 804 may queue the compute task with an occupied compute processor resource, choosing from among a plurality of compute processor resources according to an optimization metric (e.g., a load balancing metric).

In addition to load balancing considerations, scheduler/router 804 may also consider where compute processor resources are located when assigning compute tasks. In some embodiments, compute processor resources in server system 800 are located across different servers. In these embodiments, routing functionality of scheduler/router 804 may be used to route traffic to compute processor resources on multiple servers. If all compute processor resources in server system 800 are located on a single server, then no routing functionality is needed and scheduler/router 804 only requires scheduling functionality. If servers on which compute processor resources reside are located in different server clusters, a higher-level routing architecture (e.g., as shown in FIG. 2) may be used.

In the example illustrated in FIG. 8, hardware interface software 806 serves as a communication conduit between scheduler/router 804 and Type A FPGA 814. In the example shown, other hardware interface software/FPGA stacks in server system 800 also communicate with scheduler/router 804. As described above, compute processor resources (and thus their associated hardware interface software) may be located on a single server, on different servers in a single server cluster, on different servers in different server clusters, etc. The various compute processor resources implement various functions that a user could request, with the specific distribution of implemented functions across compute processor resources based at least in part on demand for those functions. In various embodiments, when scheduler/router 804 assigns a compute task to a compute processor resource (e.g., Type A FPGA 814), a request that is still in a software format (e.g., RPC format) is forwarded to hardware interface software (e.g., hardware interface software 806). The hardware interface software (e.g., hardware interface software 806) then converts the request into a format compatible with the compute processor resource (e.g., Type A FPGA 814).

In the example illustrated in FIG. 8, hardware interface software units mapped to an FPGA include a service, bitstream, and driver. For example, hardware interface software 806 includes service 808, bitstream 810, and driver 812. Service 808 is software that decodes a request message (e.g., an RPC message) and sends it to Type A FPGA 814 after the request message is converted by driver 812 into a format compatible with Type A FPGA 814. Bitstream 810 is software that determines the function that Type A FPGA 814 implements. This information is needed by scheduler/router 804 in order for scheduler/router 804 to match FPGAs with compute requests. In various embodiments, bitstream 810 and other bitstreams send information on what compute tasks FPGAs are configured to handle to scheduler/router 804. Driver 812 is software that structures the request message received by service 808 into a format that Type A FPGA 814 can use to perform the requested compute task. The components of hardware interface software 822 (service 824, bitstream 826, and driver 828) perform the above for Type B FPGA 830.

In the example illustrated in FIG. 8, hardware interface software units mapped to a GPU include a service, a shader, and driver. For example, hardware interface software 832 includes service 834, shader 836, and driver 838. Service 834 is software that decodes a request message (e.g., an RPC message) and sends it to Type B GPU 840 after the request message is converted by driver 838 into a format compatible with Type B GPU 840. Shader 836 is software that performs specialized operations (e.g., related to shading, special effects, and other image and video processing) as required for specific graphics compute tasks. Driver 838 is software that structures the request message received by service 832 into a format that Type B GPU 840 can use to perform the requested compute task. Stated alternatively, driver 838 handles communication with Type B GPU 840.

In the example illustrated in FIG. 8, hardware interface software units mapped to an ASIC include a service and driver. For example, hardware interface software 842 includes service 844 and driver 848. Service 844 is software that decodes a request message (e.g., an RPC message) and sends it to Type B ASIC 850 after the request message is converted by driver 848 into a format compatible with Type B ASIC 850. In contrast to an FPGA, an ASIC does not need a bitstream because the ASIC is permanently configured to perform one type of compute task. Driver 848 is software that structures the request message received by service 844 into a format that Type B ASIC 850 can use to perform the requested compute task. Stated alternatively, driver 848 handles communication with Type B ASIC 850.

In various embodiments, after a compute processor resource performs the requested compute task, the results of the compute are transferred back to the corresponding service, which then constructs an API response object to be sent back to scheduler/router 804, which then sends the response object back to API A 802 or API B 820 and to the user. At this point, the service is ready to accept the next request for use of the compute processor resource. Services are mapped one-to-one to compute processor resources (e.g., service 808 mapped to Type A FPGA 814). Stated alternatively, when a service is initialized, it is bound to a compute processor resource. FIGS. 3-6 provide additional details associated with performing a compute task using a compute processor resource, from identifying a service to perform a compute task to invoking the service to reporting results of the compute task.

In the example illustrated in FIG. 8, FPGAs are a type of compute processor resource that perform compute tasks. In various embodiments, the FPGAs are implemented as integrated circuits that include arrays of logic blocks that are programmable using a hardware description language (HDL). Examples of HDLs include VHDL and Verilog. The reprogrammable nature of FPGAs allows FPGAs the flexibility to be reconfigured to handle different specialized compute tasks as needed, which is not possible with other hardware technologies, such as ASICs. In addition, FPGAs can be more efficient than CPUs because FPGAs can structure computation in a more parallel manner. For example, an FPGA that implements GIF resizing may be able to try 128-256 resize combinations at once because it can implement 128-256 resizing hardware cores instead of perhaps 4 resize combinations from a 4-core CPU. An FPGA is initially unprogrammed when it is powered on. In various embodiments, the service bound to an FPGA device reads an FPGA bitstream from persistent storage and transfers it to the FPGA, thus initializing the FPGA and making it ready to accept compute requests. In various embodiments, ASICs are implemented as specially designed integrated circuits that are not reprogrammable. GPUs and CPUs are microprocessors that are reprogrammable using high-level computer programming languages.

In some embodiments, the initialization process for the system is as follows: power is applied and a host operating system loads, scheduler/router 804 is loaded, available compute processor resources are enumerated, and available service descriptions are loaded. At this point, FPGAs are powered down and unprogrammed. In various embodiments, the lifecycle of an FPGA includes being powered down, being powered up and programmed (with a service mapped to the FPGA), potentially being dynamically reconfigured, and being powered down again. Programming an FPGA requires a non-trivial amount of time. Thus, initial allocation of FPGAs to functions/algorithms performed by the FPGAs influences overall system performance. Examples of initial configuration strategies include: keeping all FPGAs powered down and unprogrammed (not allocated) until a first compute request is received, allocating a specified number of FPGAs before the first compute request (e.g., one FPGA per API), and allocating all FPGAs before the first compute request (e.g., allocated across APIs uniformly or according to a distribution based on use statistics). ASICs are not reprogrammable, so no initial allocation strategy is required for ASICs. GPUs and CPUs do not require programming and are ready to accept any compute request after power is applied to the overall server system.

Scheduler/router 804 may also allocate (e.g., program) an unallocated (e.g., unprogrammed) FPGA to perform a specified compute task that is in high demand. Hardware interface software (e.g., a service, bitstream, and driver) would be instantiated and mapped to an allocated FPGA. The function/algorithm a newly allocated FPGA is assigned to perform can depend on a variety of metrics. Examples of these metrics include queue depth and execution time. With respect to queue depth, an FPGA may be assigned to perform a function/algorithm with longer incoming queues (indicating higher demand) on already allocated FPGAs. With respect to execution time, an FPGA may be assigned to perform a function/algorithm whose outstanding compute requests are taking a longer time to execute than compute requests for other functions/algorithms. ASICs do not need to be allocated because they cannot be reprogrammed.

When all FPGA resources have already been allocated, some FPGA resources may be reallocated (e.g., redirected to handle compute tasks that are in high demand). As with allocation of unallocated FPGA resources, reallocation of FPGA resources can depend on metrics such as queue depth and execution time. For example, if one group of FPGAs that implements a particular function has a significantly higher queue depth than other groups of FPGAs, FPGAs from the other groups may be reallocated to implement the function of the group of FPGAs with the higher queue depth in order to balance queue depths across FPGA groups. ASICs cannot be reallocated because they cannot be reprogrammed.

In the example illustrated in FIG. 8, portions of the communication path between the components are shown. Other communication paths may exist, and the example of FIG. 8 has been simplified to illustrate the example clearly. Although single instances of components have been shown to simplify the diagram, additional instances of any of the components shown in FIG. 8 may exist. The number of components and the connections shown in FIG. 8 are merely illustrative. For example, more APIs, hardware interface software units, and compute processor resources than what is shown may exist. Components not shown in FIG. 8 may also exist. For example, CPU resources may also exist. As described above, implementations with a single API gateway and/or multiple scheduler/router units are also possible. In addition, different hardware interface software unit/FPGA stacks may be located in different geographic locations, and the scheduler/router may implement multiple layers of scheduling/routing.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a processor configured to:
receive a request to perform a compute task;
identify a service to perform at least a portion of the compute task, wherein the identified service is associated with a field-programmable gate array that has been programmed to perform at least the portion of the compute task; and invoke the identified service to perform at least the portion of the compute task of the request;

wherein the processor is configured to invoke the identified service including by being configured to queue the request to perform the compute task with the identified service; and the field-programmable gate array configured to execute at least the portion of the compute task.

2. The system of claim 1, wherein the request to perform the compute task is received via an application programming interface.

3. The system of claim 1, wherein the request to perform the compute task originates from a software application.

4. The system of claim 1, wherein the request to perform the compute task is in a remote procedure call message format.

5. The system of claim 1, wherein the processor is configured to identify the service to perform at least the portion of the compute task based at least in part on a determination of which field-programmable gate array resources are available to perform the compute task.

6. The system of claim 1, wherein the processor is configured to identify the service to perform at least the portion of the compute task based at least in part on a determination of which field-programmable gate array resources have been configured to execute at least the portion of the compute task.

7. The system of claim 1, wherein the processor is configured to identify the service to perform at least the portion of the compute task based at least in part on a load balancing metric.

8. The system of claim 1, wherein the processor is configured to identify the service to perform at least the portion of the compute task based at least in part on a determination of in which server clusters field-programmable gate array resources are located.

9. The system of claim 1, wherein the processor is configured to identify the service to perform at least the portion of the compute task from among a plurality of services distributed across multiple server clusters.

10. The system of claim 1, wherein the processor is configured to invoke the identified service including by being configured to assign at least the portion of the compute task to the identified service to commence performance.

11. The system of claim 1, wherein the field-programmable gate array is configured using a driver to execute at least the portion of the compute task.

12. The system of claim 1, wherein the field-programmable gate array is a part of a plurality of field-programmable gate arrays located in a single server cluster.

13. The system of claim 1, wherein the field-programmable gate array is a part of a plurality of field-programmable gate arrays located across multiple server clusters.

14. The system of claim 1, wherein the processor is further configured to report a result associated with execution of at least the portion of the compute task.

15. The system of claim 14, wherein the result is formatted as an application programming interface response object.

16. The system of claim 1, wherein the field-programmable gate array, after executing at least the portion of the compute task, is configured to be automatically reprogrammed to execute a different type of compute task.

17. The system of claim 1, wherein the field-programmable gate array is a part of a plurality of compute processor resources that are all capable of executing at least the portion of the compute task, wherein the plurality of compute resources also includes one of the following: an application-specific integrated circuit, a graphics processing unit, or a central processing unit.

18. A system, comprising:
a first processor configured to:
  receive a first request to perform a first compute task;
  identify a first service to perform at least a portion of the first compute task, wherein the identified first service is associated with a first field-programmable gate array that has been programmed to perform at least the portion of the first compute task; and
  invoke the identified first service to perform at least the portion of the first compute task of the first request;
  wherein the first processor is configured to invoke the first identified service including by being configured to queue the first request to perform the first compute task with the first identified service;
a second processor configured to:
  receive a second request to perform a second compute task;
  identify a second service to perform at least a portion of the second compute task, wherein the identified second service is associated with a second field-programmable gate array that has been programmed to perform at least the portion of the second compute task; and
  invoke the identified second service to perform at least the portion of the second compute task of the second request;
  wherein the second processor is configured to invoke the second identified service including by being configured to queue the second request to perform the second compute task with the second identified service;
the first field-programmable gate array configured to execute at least the portion of the first compute task; and
the second field-programmable gate array configured to execute at least the portion of the second compute task, wherein the first compute task is a different type of compute task than the second compute task.

19. A method, comprising:
receiving a request to perform a compute task;
identifying a service to perform at least a portion of the compute task, wherein the identified service is associated with a field-programmable gate array that has been programmed to perform at least the portion of the compute task;
invoking the identified service to perform at least the portion of the compute task of the request, wherein invoking the identified service includes queuing the request to perform the compute task with the identified service; and
executing at least the portion of the compute task using the field-programmable gate array.

20. The method of claim 19, wherein the request to perform the compute task is received via an application programming interface.

* * * * *